(12) United States Patent
Kasamsetty et al.

(10) Patent No.: US 7,420,874 B2
(45) Date of Patent: Sep. 2, 2008

(54) INTEGRATED CIRCUIT MEMORY DEVICE, SYSTEM AND METHOD HAVING INTERLEAVED ROW AND COLUMN CONTROL

(75) Inventors: Kishore Kasamsetty, Cupertino, CA (US); Lawrence Lai, San Jose, CA (US); Wayne Richardson, Saratoga, CA (US)

(73) Assignee: Rambus Inc., Los Altos, CA (US)

( * ) Notice: Subject to any disclaimer, the term of this patent is extended or adjusted under 35 U.S.C. 154(b) by 54 days.

(21) Appl. No.: 11/099,947

(22) Filed: Apr. 6, 2005

(65) Prior Publication Data
US 2006/0227646 A1 Oct. 12, 2006

(51) Int. Cl.
*G11C 8/18* (2006.01)

(52) U.S. Cl. .............................. 365/233.11; 365/230.04

(58) Field of Classification Search ................. 365/149, 365/189.02, 230.03, 233, 233.11, 233.1, 365/230.04, 230.02; 711/157
See application file for complete search history.

(56) References Cited

U.S. PATENT DOCUMENTS

| | | | |
|---|---|---|---|
| 5,083,296 A | | 1/1992 | Hara et al. |
| 5,517,459 A | * | 5/1996 | Ooishi .................... 365/230.08 |
| 5,825,710 A | | 10/1998 | Jeng et al. |
| 6,449,679 B2 | * | 9/2002 | Ryan ........................... 710/315 |
| 6,459,646 B1 | * | 10/2002 | Yee et al. ............... 365/230.03 |
| 6,564,288 B2 | * | 5/2003 | Olarig et al. ................. 711/105 |
| 6,915,399 B1 | * | 7/2005 | McDonnell et al. ......... 711/167 |
| 2002/0010831 A1 | * | 1/2002 | DeMone et al. ............. 711/105 |

* cited by examiner

*Primary Examiner*—Richard T. Elms
*Assistant Examiner*—Douglas King
(74) *Attorney, Agent, or Firm*—Vierra Magen Marcus & DeNiro LLP (57) ABSTRACT

An integrated circuit memory device, system and method embodiments decode interleaved row and column request packets transferred on an interconnect at a first clock frequency. Separate row decode logic and column decode logic, clocked at a relatively slower second clock frequency, output independent column and row control internal signals to a memory core in response to memory commands in the request packets. An integrated circuit memory device includes an interface having separate row and column decode logic circuits for providing independent sets of row and control signals. A row decode logic circuit includes a first row decode logic circuit that provides a first row control signal, such as a row address, and a second row decode logic circuit that provides a second row control signal. A column decode logic circuit includes a first column decode logic circuit that provides a first column control signal, such as a column address and a second column logic circuit that provides a second column control signal.

23 Claims, 8 Drawing Sheets

INTEGRATED CIRCUIT MEMORY DEVICE, SYSTEM AND METHOD HAVING INTERLEAVED ROW AND COLUMN CONTROL

FIELD OF THE INVENTION

The present invention generally relates to memory devices and memory systems.

BACKGROUND OF THE RELATED ART

In some memory systems, control information such as memory commands and address information are typically generated by a memory controller, and packaged in the form of request packets (e.g., control information multiplexed with address information over a common interconnect resource). An integrated circuit memory device, such as a dynamic random access memory ("DRAM") device, may receive and translate the information into control signals for a memory core of the memory device.

As memory device bandwidth is increased, scaling or increasing the integrated circuit memory device internal clock frequency to meet an increased bandwidth requirement for processing request packets may unduly increase complexity and power and reduce timing margins of the integrated circuit memory device.

BRIEF DESCRIPTION OF THE DRAWING

Embodiments are illustrated by way of example, and not by way of limitation, in the figures of the accompanying drawings, which like reference numerals refer to similar elements.

DETAILED DESCRIPTION

Embodiments, including a memory device, system and methods, are disclosed that use interleaved row and column request packets that are sampled at a multiple of an internal clock used to process the row and column request packets. In several embodiments, methods include a memory device receiving interleaved row and column request packets at a clocked interface of the memory device. Decode logic circuits of the memory device convert the row and column commands in the request packets to independent command streams utilizing a slower clock frequency relative to the request interface of the memory device. These independent command streams can be individually decoded to generate the operations for the memory core. In several embodiments, since the independent command streams are clocked at a lower rate with respect to the interface of the memory device, the individual and independent decode logic circuits can use a lower frequency clock and internal pipelines may be reduced in depth.

In an embodiment, a memory device receives interleaved row and column request packets that include control information, such as memory commands or operational codes indicating a memory operation and address information. In this embodiment, the row and column decode logic circuits used to access data from the memory core are controlled by independent sets of control signals. This will allow for the decode logic circuits to separate the commands into slower row and column command streams, to decode and issue the row and column operations to the memory core and in an embodiment, save area and power.

In another embodiment, interleaved row and column commands can be ping-ponged between independent cores within the memory device. In this embodiment, the row and column commands pertaining to the two independent cores are received in an interleaved manner at the pins or interface of the memory device. A clock signal is used to sample the row and column commands at the interface. Independent command streams within the memory device are clocked using a clock signal having approximately half the frequency of a clock signal used to sample the row and column commands. The independent command streams correspond to individual row and column operations for each independent core.

Separate row and column decode logic circuits are provided in an integrated circuit memory device in order to take advantage of received interleaved row or column request packets in an embodiment. The row and column decode logic circuits may be separated because each outputs different memory core interface internal signals or control signals. A clock signal used to sample the request packets is multiplied up (for example by double the frequency) relative to an internal clock signal used to synchronize the separate row and column decode logic circuits. In an embodiment, row request packets are aligned or clocked off a falling edge of the internal clock signal and column request packets are clocked off a rising edge of the internal clock signal.

Figure 1:
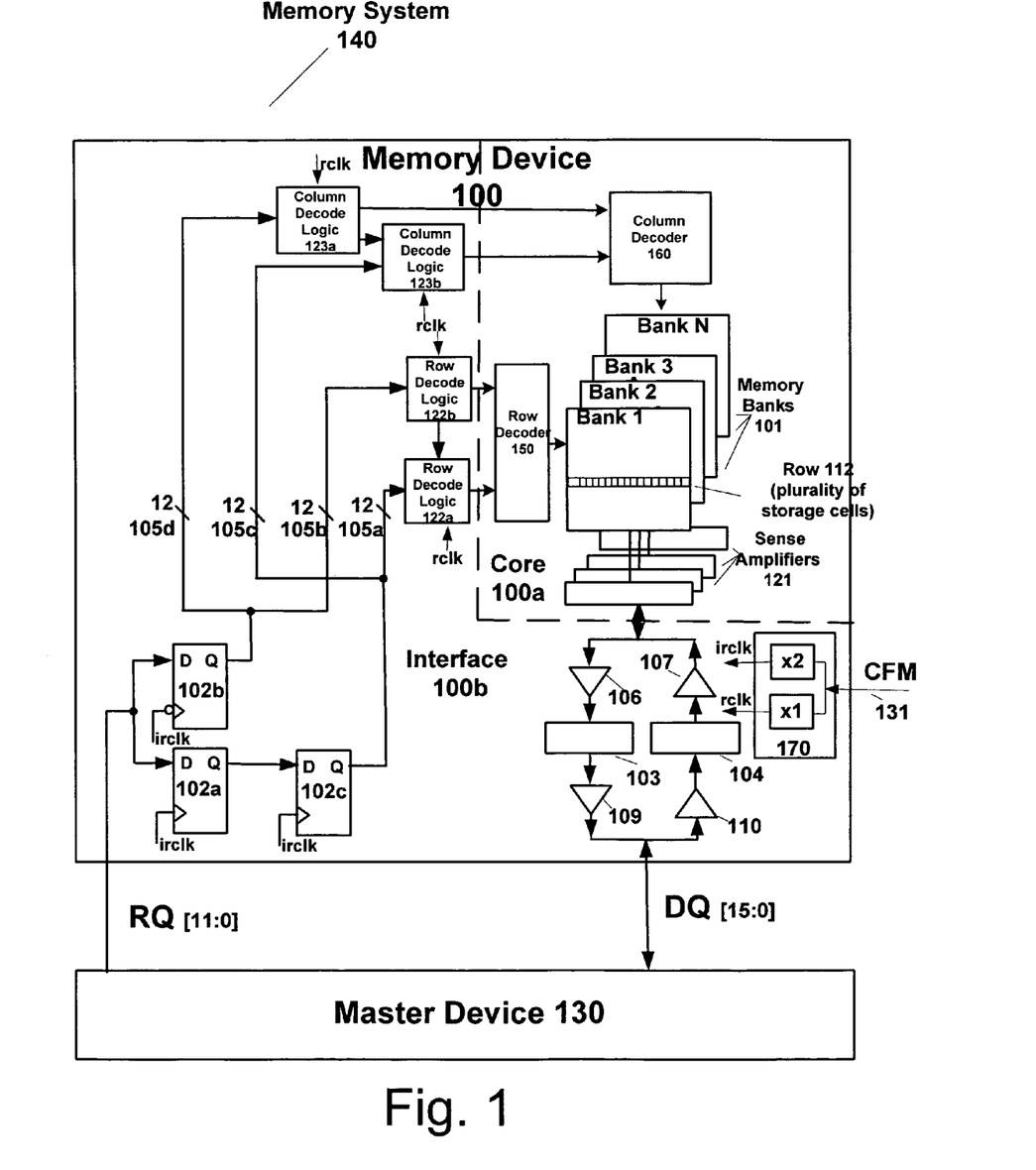
FIG. 1 illustrates a memory system including an integrated circuit memory device having row and column decode logic circuits according to an embodiment.

FIG. 1 illustrates a memory system 140 including an integrated circuit memory device 100 coupled to master device 130 by interconnects RQ and DQ as well as clock signal line 131. Integrated circuit memory device 100 includes N memory banks 101 in a memory core 100a and an interface 100b including column decode logic circuits 123a and 123b, and row decode logic circuits 122a and 122b. Memory device 100 also includes transmitter circuits 109 to output read data accessed from memory core 100a via read pipeline 103 and circuitry 106. Receiver circuits 110 receive data to be written to memory core 100a via write pipeline 104 and circuitry 107.

In an embodiment, integrated circuit memory device 100 receives interleaved row and column request packets that include control information, such as memory operation commands and address information. A request packet represents one or more signals asserted at particular bit windows on particular signal lines on interconnect RQ in an embodiment. A row decoder 150 and column decoder 160 are controlled by independent sets of control resources, for example, row decoder 150 and row decode logic circuits 122a and 122b and column decoder 160 and column decode logic circuits 123a and 123b. In this embodiment, request decode logic is separated into slower row and column command streams that decode and issue independent sets of internal row and column operation control signals to a memory core 100a.

Row decoder 150 and column decoder 160 are used to access data stored in memory banks 101 in response to control signals received by way of row decode logic circuits 122a and 122b and column decode logic circuits 123a and 123b. In an embodiment, control signals are generated in response to commands and addresses received by memory device 100 at interface 100b. For example, data stored in a plurality of storage cells, such as row 112, is sensed using sense amplifiers 121 in response to a row command. Row 112 is identified by a row address provided to row decoder 150. A subset of the data sensed in sense amplifiers 121 is selected in response to a column command. The subset of the data is identified by a column address provided to column decoder 160.

Memory device 100 includes a plurality of paths or pipeline stages operating or clocked by an internal clock signal rclk. The pipeline stages provide independent sets of internal control signals to row decoder 150 and column decoder 160. In an embodiment, a frequency of clock signal irclk is equal to an approximate multiple of internal clock signal rclk and is used to sample request packets at interface 100b from interconnect RQ. In an embodiment, a multiplier circuit 170 multiplies the clock frequency of an external clock signal, such as a clock from master (CFM) clock signal by some multiple and provides clock signal irclk to registers 102a-c to sample request packets. In an embodiment, a frequency of internal clock signal rclk is approximately half the frequency of clock signal irclk. In an embodiment, multiplier circuit 170 is a phase locked loop circuit.

Pipeline register 102a is coupled to interconnect RQ and outputs values to an input of register 102c in response to clock signal irclk. Register 102c outputs values on signal lines 105a and 105c (for example 12 signal lines and accompanying control lines). Pipeline register 102b is also coupled to interconnect RQ and outputs values on signal lines 105b and 105d in response to clock signal irclk. Signal lines 105a and 105b are coupled to row decode logic circuits 122a and 122b, to provide a row address and row timing signals to each of row decode logic circuits 122a and 122b. Signal lines 105d and 105c are coupled to column decode logic circuits 123a and 123b to provide a column address and column timing signals to each of column decode logic circuits 123a and 123b, respectively.

In an embodiment, differential signals are transferred between memory device 100 and master device 130 on interconnect RQ, interconnect DQ and clock signal line 131, singly or in combination.

A clock signal line 131 provides a clock signal to a multiplier circuit 170 in memory device 100. In an embodiment, multiplier circuit 170 outputs a clock signal irclk to registers 102a-c for clocking integrated circuit memory device 100 transactions or request packets. In an embodiment, multiplier circuit 170 provides a clock signal rclk to column decode logic circuits 123a and 123b as well as to row decode logic circuits 122a and 122b. In an embodiment, a clock signal provided on signal line 131 is a clock signal, such as a CFM clock signal, provided to integrated circuit memory device 100 by master device 130. In alternate embodiments, a clock signal on signal line 131 is provided by another source, such as a clock generator. In other embodiments, a clock signal on signal line 131 serves as a reference signal for a clock recovery circuit, which generates clocking signals used in interface 100b.

Figure 2A:
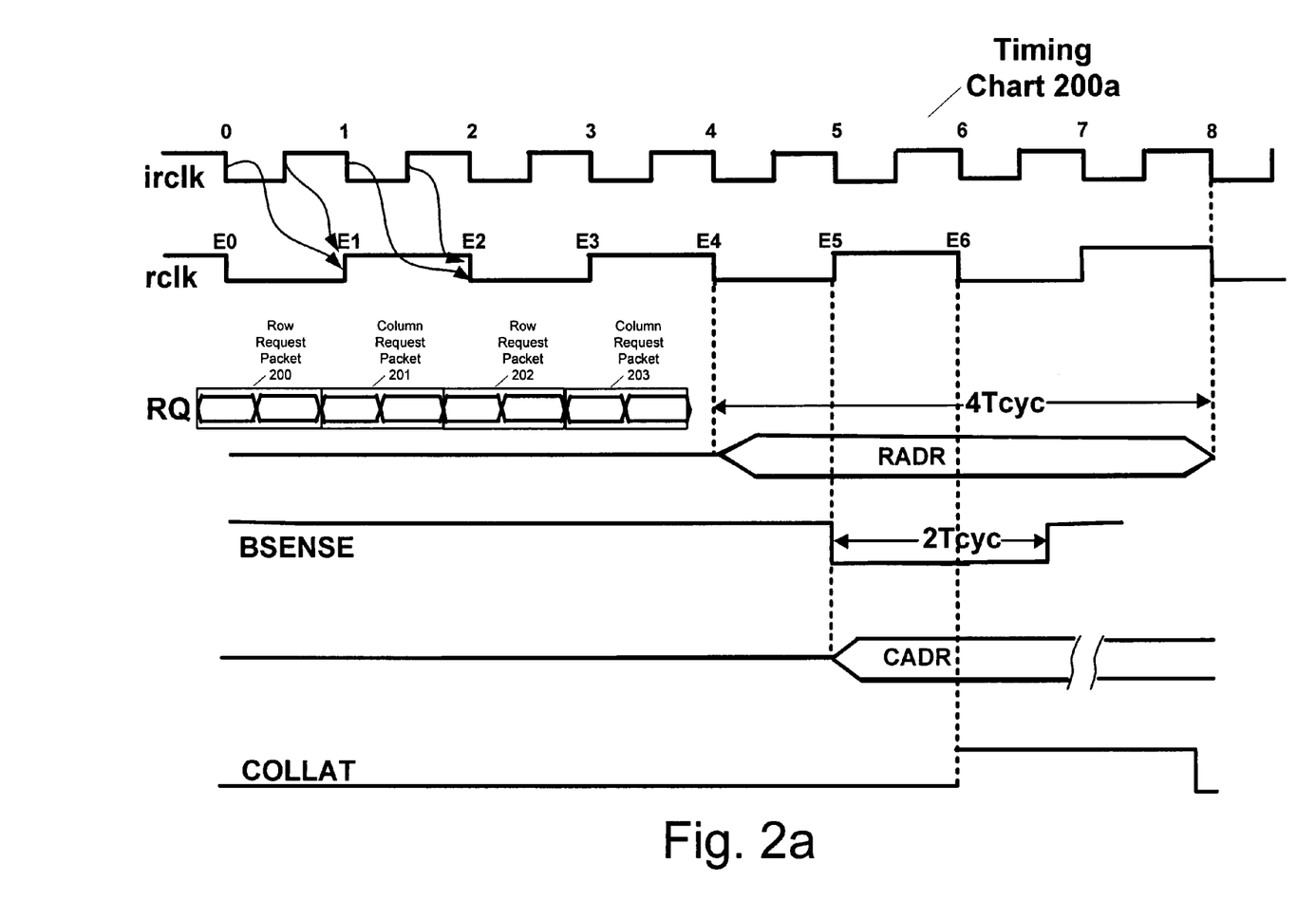
FIGS. 2a-b are timing charts illustrating interleaving row and column request packets on an interconnect and generating internal row and column control signals of an integrated circuit memory device according to an embodiment.
Figure 2B:
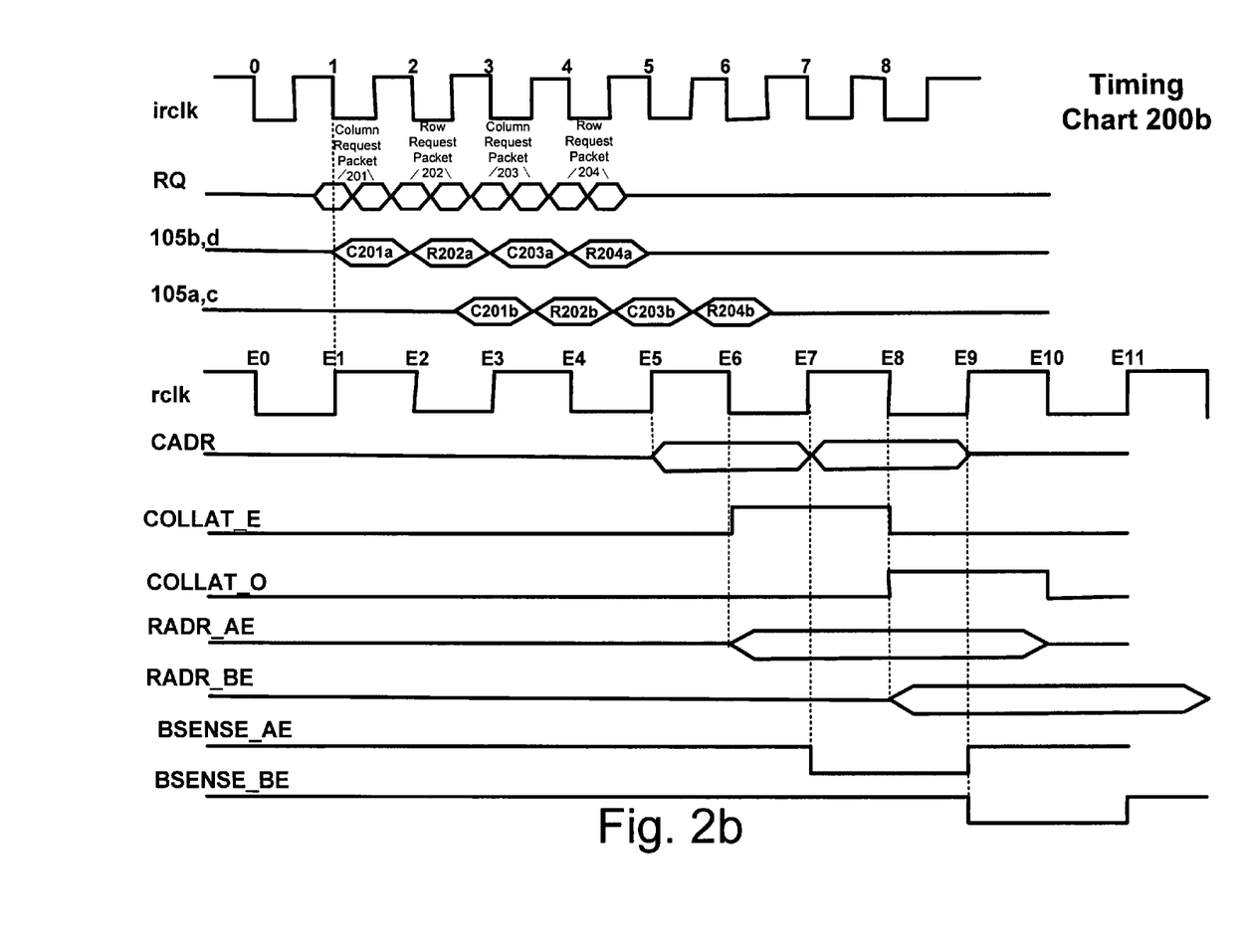

FIGS. 2a-b illustrate timing charts 200a and 200b of memory system 140 shown in FIG. 1. In particular, timing chart 200a illustrates the operation of row and column decode logic circuits in integrated circuit memory device 100 operating at a clock signal rclk, or outputting internal memory control signals and address information that is clocked or synchronized at a frequency of clock signal rclk. FIGS. 2a-b show aligning row and column request packets 200-204 to either a falling edge (for example edge E0) or a rising edge (for example edge E1) of clock signal rclk. In an embodiment, row request packets are initiated on a falling or negative edge of clock signal rclk and column request packets are initiated on a rising or positive edge of clock signal rclk. This alignment enables row and column decode logic circuits to operate or to be clocked at different clock polarities of a relatively slower clock signal rclk as compared to clock signal irclk.

Figure 3:
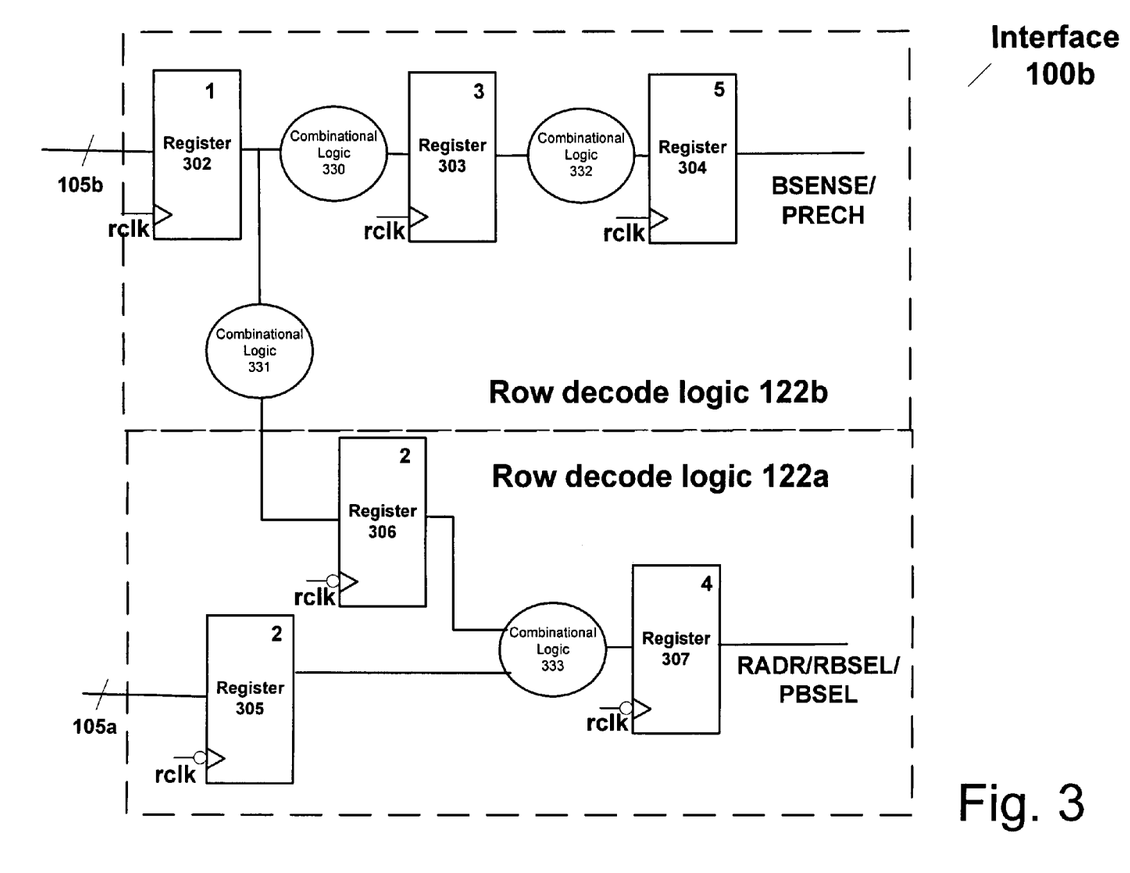
FIG. 3 is a schematic of a row decode logic circuit shown in FIG. 1 according to an embodiment.

For example, a row control signal, such as a row address RADR, is provided to row decoder 150 at negative edge E4 of clock signal rclk, as shown in FIG. 2a, by row decode logic circuits 122a and 122b in response to a row request packet 200 provided at interface 100b, and in particular at registers 102a and 102b shown in FIG. 1. In an embodiment, a row address RADR is asserted for approximately four-cycle times (4 Tcyc) of clock signal irclk. In an embodiment, row address RADR is output from row decode logic circuit 122a, and in particular from register 307 as shown in FIG. 3.

Figure 4:
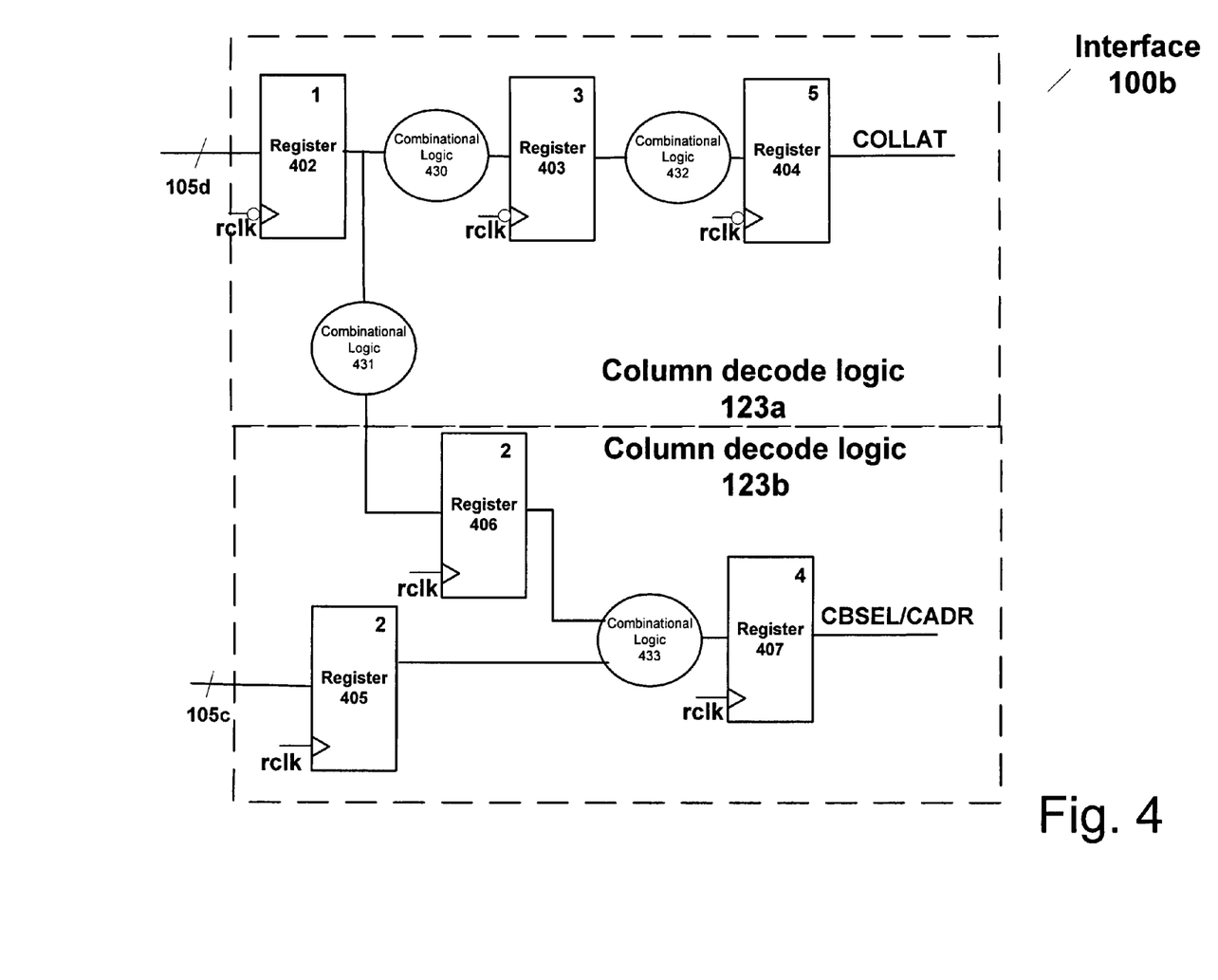
FIG. 4 is a schematic of a column decode logic circuit shown in FIG. 1 according to an embodiment.

A column control signal, such as a column address CADR, is provided to column decoder 160 at positive edge E5 of clock signal rclk, as shown in FIG. 2a, by column decode logic circuits 123a and 123b in response to a column request packet 201 provided at interface 100b, and in particular at registers 102a and 102b shown in FIG. 1. In an embodiment, column address CADR is output from column decode logic circuit 123b, and in particular from register 407 as shown in FIG. 4.

A row control signal, or in particular an internal timing signal to sense a row during a row access cycle, such as row control signal BSENSE, is provided to row decoder 150 at positive edge E5 of clock signal rclk by row decode logic circuit 122b in response to a row request packet 202 provided at interface 100b, and in particular at register 102b shown in FIG. 1. In an embodiment, a row control signal BSENSE is asserted for approximately two-cycle times (2 Tcyc) of clock signal irclk. In an embodiment, a row control signal BSENSE is output from row decode logic circuit 122b, and in particular from register 304 as shown in FIG. 3.

A column control signal, or in particular an internal timing signal to latch a column address during a column cycle, such as a column control signal COLLAT, is provided at a negative edge E6 of clock signal rclk by column decode logic circuit 123a in response to a column request packet 203 provided at interface 100b, in particular register 102b. In an embodiment, column control signal COLLAT is output from column decode logic circuit 123a, and in particular from register 404 as shown in FIG. 4.

In an embodiment, a clock signal rclk has an approximate 400 MHz frequency.

FIG. 2b illustrates an expanded timing chart 200b of memory system 140. As with timing chart 200a, column and row request packets are interleaved and transferred on interconnect RQ from master device 130 to memory device 100. FIG. 2b illustrates column and row request packets that are sampled by memory device 100, in particular by registers 102a-b, on rising and falling edges of a clock signal irclk. In an embodiment, clock signal irclk is approximately twice the clock frequency of a clock signal CFM. Column and row operation commands, including row and column addresses in request packets 201-204 are output from registers 102a-c to a plurality of signal lines 105b,d and 105a,c. Clock signal rclk is used to clock or synchronize interface logic 100b of memory device 100. In an embodiment, clock signal rclk operates at approximately the same frequency as a clock signal CFM. A first column control signal, such as a column address CADR is clocked or output at a rising edge of clock signal rclk (for example, edges E5 and E7) and a second column control signal, such as a column control signal COLLAT_E or COLLAT_O, is output at a falling edge of clock signal rclk (for example, edges E6 and E8). Similarly, a first row control signal, such as a row address RADR_AE or RADR_BE, is clocked or output at a falling edge of clock signal rclk (for example edges E6 and E8) and a second row control signal, such as a row control signal BSENSE_AE or BSENSE_BE, is output at a rising edge of clock signal rclk (for examples edges E7 and E9).

FIG. 3 illustrates a portion of interface 100b and row decode logic circuits 122a and 122b. Row request packets are aligned using the relatively slower rclk clock signal to clock pipeline stages. Row request packets are provided on interconnect RQ at interface 100b. Registers 102a and 102b sample the row request packet on interconnect RQ in response to clock signal irclk. The numbers in the right hand corner of registers or flip-flops in FIG. 3 represent a number of rclk clock cycles from receiving a row request packet at interface 100b to that particular pipeline stage or register. Accordingly, a first row request packet is sampled by registers 102a and 102b on the rising and falling edges of clock signal irclk as shown in FIG. 1. Register 102c latches the output of register 102a at one and one-half an irclk cycle later in order to prevent a hold time conflict. The output of register 102b is input to row decode logic circuit 122b, by way of signal lines 105b. Row decode logic circuit 122b then outputs row control signals, such as a row control signal BSENSE as described above, to row decoder 150 in an embodiment. An internal timing signal to precharge a row, or a row control signal PRECH, may also be output from row decode logic circuit 122b. In particular, a register 102b provides an input to register 302 that provides an output to combinational logic 330 and 331. The output of combinational logic 331 is provided to row decode logic circuit 122a, in particular register 306. The output of combinational logic 330 is output to register 303. The output of register 303 provides an input to combinational logic 332, which in turn provides an input to register 304. A row control signal is then output from register 304.

In row decode logic circuit 122a, register 102c provides an input to register 305 by way of signal lines 105a. Registers 306 and 305 then provide inputs to combinational logic 333. The output of combinational logic 333 is provided to an input of register 307. Row control signals are then output from row decode logic circuit 122a and in particular output from register 307 to row decoder 150 in an embodiment. In embodiments, row control signals output from register 307 include row address RADR as described above as well as a bank address that specifies which memory bank to activate a row, or a memory bank address RBSEL, and a bank address that specifies which bank to precharge, or a memory bank address PBSEL.

Figure 5:
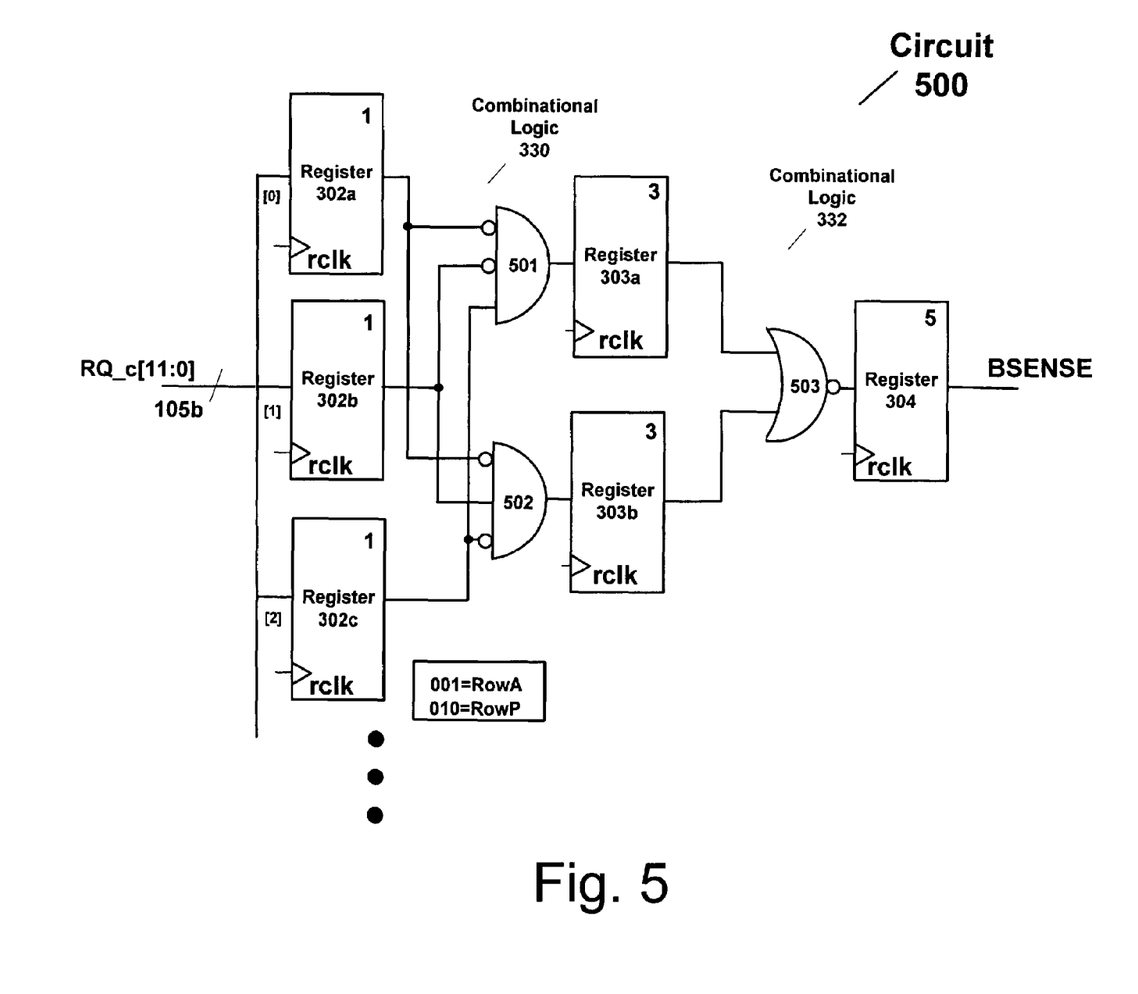
FIG. 5 is a schematic of a row decode logic circuit shown in FIG. 3 according to an embodiment.
Figure 6:
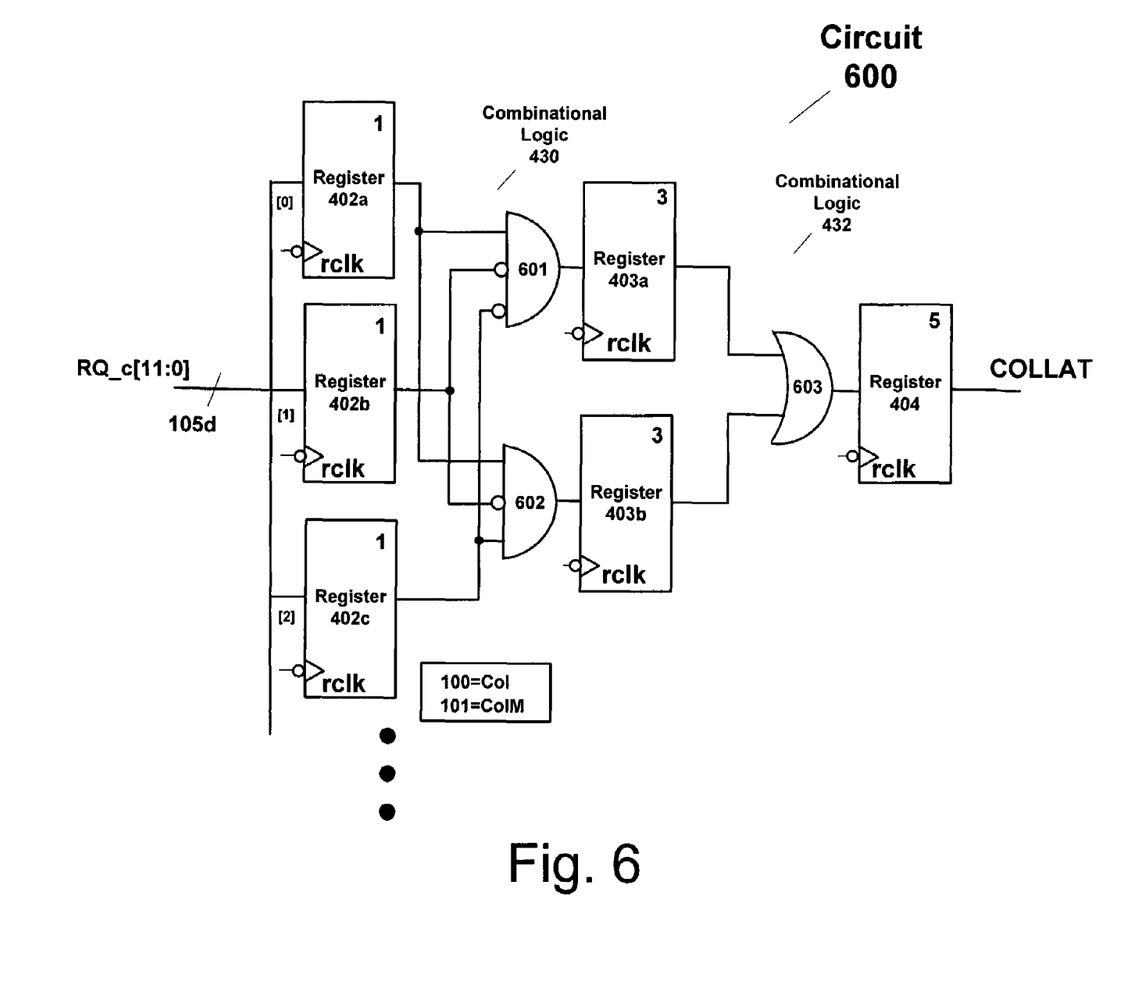
FIG. 6 is a schematic of a column decode logic circuit shown in FIG. 4 according to an embodiment.

Combinational logic illustrated in FIGS. 3 and 4 may include a variety of logic and gate types, including but not limited to, NOT (inverter), AND, NAND, OR, NOR, EX-OR or EX-NOR gates. An embodiment of a particular combinational logic is illustrated in FIGS. 5 and 6 and described in detail below. Registers shown in row decode logic circuits 122a and 122b, and column decode logic circuits 123a and 123b described below, represent multiple registers in multiple embodiments.

FIG. 4 illustrates a portion of interface 100b and column decode logic circuits 123a and 123b. FIG. 4 illustrates aligning column operation packets using the relatively slower rclk clock signal. Column request packets are provided on interconnect RQ at interface 100b. Registers 102a and 102b shown in FIG. 1, sample the column request packets on interconnect RQ in response to clock signal irclk and provide values on signal lines 105c and 105d. The numbers in the right hand corner of the registers or flip-flops represent the number of rclk clock cycles from receiving a column request packet at interface 100b to that particular pipeline stage or register. Accordingly, a first column request packet is sampled by register 102a and register 102b on the rising and falling edges of clock signal irclk. Register 102c latches the output of register 102a at one and one-half an irclk cycle later in order to prevent a hold time conflict.

The output of register 102b is input to column decode logic circuit 123a by ways of signal lines 105d. Column decode logic circuit 123a then outputs column control signals, such as column control signal COLLAT as described above. In particular, a register 102b provides on signal lines 105d an input to register 402 that provides an output to combinational logic 430 and 431. The output of combinational logic 431 is provided to column decode logic circuit 123b, in particular register 406. The output of combinational logic 430 is output to register 403. The output of register 403 provides an input to combinational logic 432, which in turn provides an input to register 404. Column control signals are then output from register 404.

In column decode logic circuit 123b, register 102c provides an input to register 405 by way of signal lines 105c. Registers 406 and 405 then provide inputs to combinational logic 433. The output of combinational logic 433 is provided to an input of register 407. Column control signals, such as a column address CADR, are then output from column decode logic circuit 123b and in particular output from register 407 to column decoder 160. In embodiments, column control signals output from register 407 include a memory bank address CBSEL that specifies which bank to perform a column access.

FIG. 5 is a schematic of circuit 500 illustrating a portion of interface 100b and row decode logic circuit 122b shown in FIG. 3. In particular, FIG. 5 illustrates an embodiment of combinational logic 330 and combinational logic 332 in outputting a row control signal BSENSE. As shown in FIG. 3, signals RQ_c[11:0] are provided on signal lines 105b from register 102b. Each signal RQ_c[11:0] is provided to respective registers, as illustrated by registers 302a-c. In an embodiment, combinational logic 330 includes AND gates 501 and 502 having inputs coupled to the respective outputs of registers 302a-c. Outputs of AND gates 501 and 502 are input to registers 303a and 303b. Outputs of registers 303a and 303b are input to combinational logic 332, in particular NOR gate 503, which outputs a signal to register 304. In an embodiment, register 304 then outputs a row control signal BSENSE. Thus in an embodiment illustrated by FIG. 5, a RowA value having a "001" logic value provided by a row request packet on RQ[0:2] provides a first logic value or voltage level for a row control signal BSENSE and a RowP value having a "010" logic value provided by a row request packet on RQ[0:2] provides a second logic value or voltage level for the row control signal BSENSE.

FIG. 6 is a schematic of circuit 600 illustrating a portion of interface 100b and column decode logic circuit 123a shown in FIG. 4. In particular, FIG. 6 illustrates an embodiment of combinational logic 430 and combinational logic 432 in outputting a column control signal COLLAT. As shown in FIG. 4, signals RQ_c[11:0] are provided on signal lines 105d from register 102b. Each signal RQ_c[11:0] is provided to respective registers, as illustrated by registers 402a-c. In an embodiment, combinational logic 430 includes AND gates 601 and 602 having inputs coupled to the respective outputs of registers 402a-c. Outputs of AND gates 601 and 602 are input to registers 403a and 403b. Outputs of registers 403a and 403b are input to combinational logic 432, in particular OR gate 603, which outputs a signal to register 404. In an embodiment, register 404 outputs a COLLAT signal when a column request packet on RQ[0:2] includes a memory operation code where Col or ColM have a logic value of "100" or "101."

FIG. 2b also illustrates the operation or synchronization of row and column decode logic circuits 122a-b and 123a-b shown in FIGS. 3 and 4. In particular, FIG. 2b illustrates how interleaved row and column request packets 201-204 provided on interconnect RQ are decoded by row decode logic circuits 122a and 122b as well as column decode logic circuits 123a and 123b to provide independent sets of row and column control signals. Column request packets (for example column request packet portions C201a and C201b of column request packet 201) are provided on signal lines 105d and 105c to column decode logic circuits 123a and 123b and are clocked or synchronized by rising edges of clock signal rclk. Similarly, row request packets (for example row request packet portions R202a and R202b of row request packet 202) are provided on signal lines 105a and 105b to row decode logic circuits 122a and 122b and are clocked by falling edges of clock signal rclk.

In an embodiment, operation codes used in row and column request packets may be reduced. In an embodiment, half the typical row and column operation codes may be used. Because row and column decoding is separated and decoded using alternating clock edges of an internal clock signal rclk, the same operation code in a row request packet which is used for generating a row control signal may also be used in a column request packet which is used for generating a column control signal.

Figure 7:
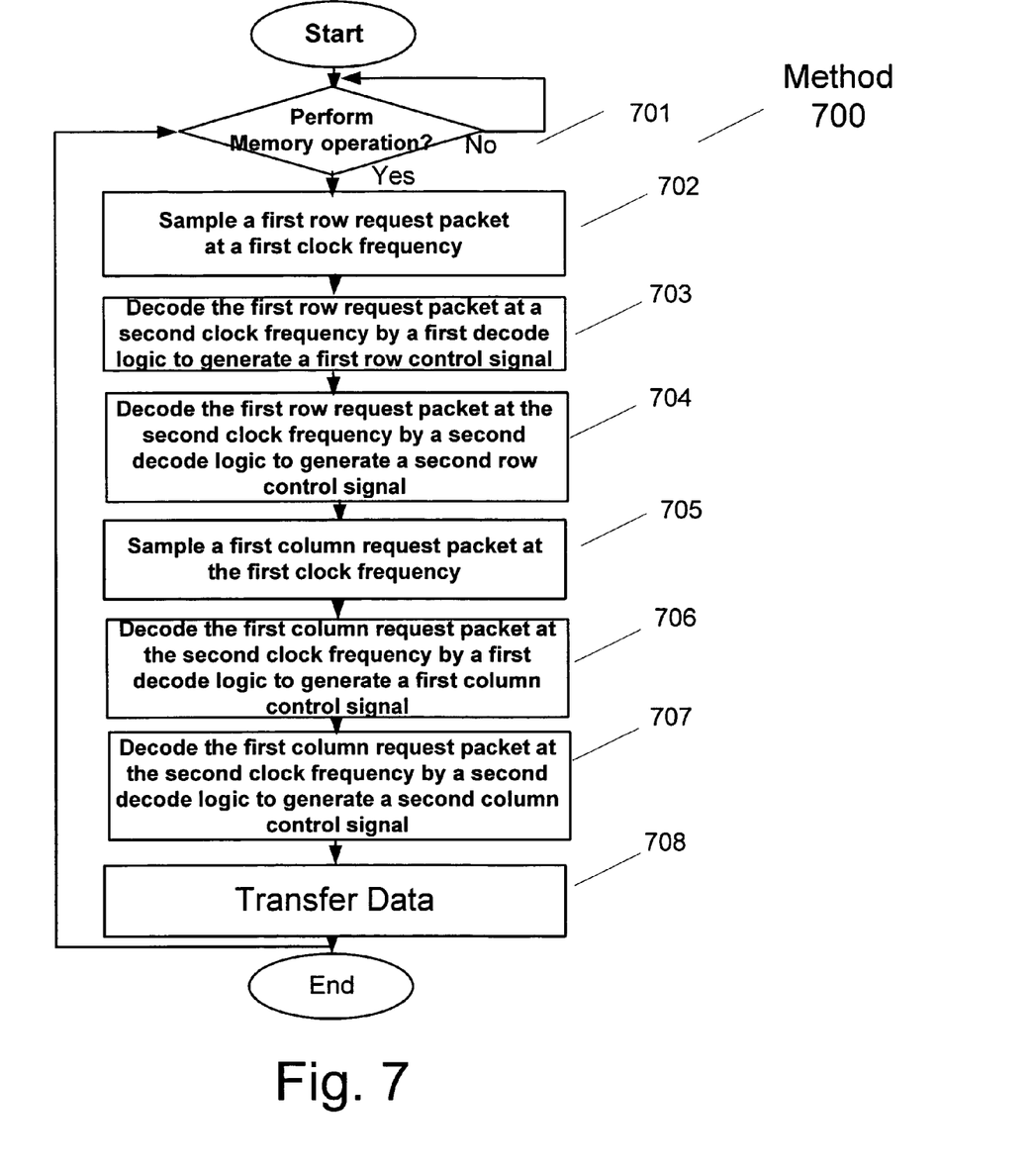
FIG. 7 is a flow chart illustrating a method according to an embodiment.

FIG. 7 illustrates a method 700 embodiment for operating an integrated circuit memory device in a memory system. In alternate embodiments of the present invention, steps or logic blocks illustrated in FIG. 7 are carried out by hardware, software or a combination thereof. In alternate embodiments, the circuits illustrated in FIGS. 1, 3, 4, 5 and 6 carry out the steps illustrated in FIG. 7. Other steps that are not shown may be included in various embodiments. Similarly, steps that are shown may be excluded in various embodiments. Also, while method 700 is described in sequential steps, method steps or logic blocks of method 700 are completed very quickly or almost instantaneously.

FIG. 7 illustrates a method 700 that begins at logic block 701 where a determination is made whether an operation is to be performed by an integrated circuit memory device. If an integrated circuit memory device operation is to be performed, control transitions to logic block 702 where a first row request packet is transferred and sampled at an integrated circuit memory device at a first clock frequency. In an embodiment, an integrated circuit memory device 100 shown in FIG. 1 receives a first row request packet on interconnect RQ as illustrated by row request packet 200 in FIG. 2a. In an embodiment, the first row request packet is received and stored in registers 102a and 102b. In logic block 703, the first row request packet is decoded by a first row decode logic, such as row decode logic circuit 122a, at a second clock frequency in order to provide a first internal row control signal. In logic block 704, the first row request packet is decoded by a second row decode logic, such as row decode logic circuit 122b, at a second clock frequency in order to provide a second internal row control signal. In an embodiment, the first clock frequency is approximately twice the second clock frequency.

In logic block 705, a first column request packet is transferred and sampled at an integrated circuit memory device at the first clock frequency. In an embodiment, an integrated circuit memory device 100 shown in FIG. 1 receives a first column request packet on interconnect RQ as illustrated by request packet 201 in FIG. 2a. In an embodiment, the first column request packet is received and stored in registers 102a and 102b. In logic block 706, the first column request packet is decoded by a second decode logic, such as column decode logic circuit 123a, at the second clock frequency in order to provide a first internal column control signal. In logic block 707, the first column request packet is decoded by a second decode logic, such as column decode logic circuit 123b, at the second clock frequency in order to provide a second internal column control signal. In logic block 708, data is transferred to or from an integrated circuit memory device in the form of write or read data. In an embodiment, row and column request packets are interleaved. In an embodiment, logic blocks 702-708 are repeated until memory operations are complete. Method 700 then ends.

Returning to the embodiments illustrated by FIG. 1, interface 100b includes a plurality of conducting contacts, such as pins and/or balls, for coupling to interconnect RQ, interconnect DQ and one or more clock signal lines 131. In an embodiment, interface 100b includes twelve pins for coupling to interconnect RQ and sixteen pins for coupling to interconnect DQ. More or less contacts may be provided in alternate embodiments.

Memory banks 101 include individual memory banks having a two dimensional array of storage cells. In an embodiment, memory banks 101 include 16 memory banks. In an embodiment, a memory bank includes 2048 rows of storage cells. Each row 112 includes 64 addressable columns that each store 16 bytes of information (or 1024 bytes per page). In embodiments, storage cells of memory banks 101 may be dynamic random access memory ("DRAM") cells, static random access memory ("SRAM") cells, FLASH cells, ferroelectric RAM ("FRAM") cells, magnetoresistive or magnetic RAM ("MRAM") cells, or other equivalent types of memory storage cells. In an embodiment, integrated circuit memory device 100 is a double data rate SDRAM ("DDR") integrated circuit memory device or later generation memory device (e.g., "DDR2"). In an alternate embodiment, integrated circuit memory device 100 is an XDR™ DRAM integrated circuit memory device or Direct Rambus® DRAM ("DRDRAM") memory device.

In embodiments, master device 130 is a memory controller, which may be an integrated circuit device that contains other interfaces or functionality, for example, a Northbridge chip of a chip set. The memory controller may be integrated on a microprocessor or a graphics processor unit ("GPU") or visual processor unit ("VPU"). The memory controller may be implemented as a field programmable gate array ("FPGA"). The memory device and master device 130 may be included in various systems or subsystems such as personal computers, graphics cards, set-top boxes, cable modems, cell phones, game consoles, digital television sets (for example, high definition television ("HDTV")), fax machines, cable modems, digital versatile disc ("DVD") players or network routers.

In an embodiment, integrated circuit memory device 100 is positioned on a substrate in a memory module, such as a dual-in-line-module (DIMM) that includes a plurality of memory devices employed with a connector interface that includes contacts.

In an alternate embodiment, master device 130, integrated circuit memory device 100 and associated interconnects are in an integrated monolithic circuit.

Signals described herein may be transmitted or received between and within devices by electrical conductors and generated using any number of signaling techniques including without limitation, modulating the voltage or current level of an electrical signal. The signals may represent any type of control and timing information (e.g. commands, address values, clock signals, and configuration information) as well as data. Also, a single signal illustrated may represent a plurality of signals on respective signal lines in an embodiment.

In embodiments, interconnects described herein include a plurality of conducting elements or conducting paths such as a plurality of wires and/or metal traces/signal lines. In an embodiment, a single conducting path illustrated in the Figures may be replaced by multiple conducting paths and multiple signal paths illustrated in the Figures may be replaced by a single conducting path. In embodiments, an interconnect may include a bus and/or point-to-point connection. In an embodiment, interconnects include control and data signal lines. In an alternate embodiment, interconnects include only data signal lines or only control signal lines. In still other embodiments, interconnects are unidirectional (signals that travel in one direction) or bidirectional (signals that travel in two directions) or combinations of both unidirectional signal lines and bidirectional signal lines.

It should be noted that the various circuits disclosed herein may be described using computer aided design tools and expressed (or represented) as data and/or instructions embodied in various computer-readable media, in terms of their behavior, register transfer, logic component, transistor, layout geometries, and/or other characteristics. Formats of files and other objects in which such circuit expressions may be implemented include, but are not limited to: formats supporting behavioral languages such as C, Verilog, and HLDL; formats supporting register level description languages like RTL; formats supporting geometry description languages such as GDSII, GDSIII, GDSIV, CIF, MEBES; and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.). When received within a computer system via one or more computer-readable media, such data and/or instruction-based expressions of the above described circuits may be processed by a processing entity (e.g., one or more processors) within the computer system in conjunction with execution of one or more other computer programs including, without limitation, netlist generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

The foregoing description of the preferred embodiments of the present invention has been provided for the purposes of illustration and description. It is not intended to be exhaustive or to limit the embodiments to the precise forms disclosed. Modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. An integrated circuit memory device comprising:
   a plurality of contacts to receive a plurality of signals representing control information at a first clock frequency, wherein the plurality of signals includes a plurality of row memory commands and row addresses and a plurality of column memory commands and column addresses, wherein the plurality of row memory commands and row addresses are interleaved with the plurality of column memory commands and column addresses;
   a first decode logic to decode the plurality of row memory commands using a second clock frequency into a plurality of row control signals; and
   a second decode logic to decode the plurality of column memory commands using the second clock frequency into a plurality of column control signals.

2. The integrated circuit of memory device of claim 1, wherein the first decode logic is independent of the second decode logic.

3. The integrated circuit memory device of claim 1, wherein the plurality of row control signals are provided to a memory core of the integrated circuit memory device.

4. The integrated circuit memory device of claim 3, wherein the memory core includes a row decoder and the plurality of row control signals is provided to the row decoder.

5. The integrated circuit memory device of claim 3, wherein the plurality of row control signals includes a row address.

6. The integrated circuit memory device of claim 3, wherein the plurality of row control signals includes a signal to sense a row during a row access cycle.

7. The integrated circuit memory device of claim 3, wherein the plurality of column control signals is provided to the memory core of the integrated circuit memory device.

8. The integrated circuit memory device of claim 7, wherein the memory core includes a column decoder and the plurality of column control signals is provided to the column decoder.

9. The integrated circuit memory device of claim 7, wherein the plurality of column control signals includes a column address.

10. The integrated circuit memory device of claim 7, wherein the plurality of column control signals includes a signal to latch a column address during a column cycle in the memory core.

11. The integrated circuit memory device of claim 1, comprising:
   a first register to sample a first row request packet in the plurality of control signals using the first clock frequency; and
   a second register to sample the first row request packet in the plurality of control signals using the first clock frequency.

12. The integrated circuit memory device of claim 1, wherein the first and second decode logic include combinational logic.

13. A memory system, comprising:
   a master device to provide a plurality of row and column request packets using a first clock frequency, wherein a plurality of row request packets includes row control information and row addresses and a plurality of column request packets includes column control information and column addresses, wherein the plurality of row request packets is interleaved with the plurality of column request packets; and an integrated circuit memory device including,
    a plurality of contacts to receive the plurality of row and column request packets using the first clock frequency,
    a first decode logic to decode the row control information using a second clock frequency into a plurality of row control signals; and
    a second decode logic to decode the column control information using the second clock frequency into a plurality of column control signals.

14. The memory system of claim 13, wherein the first decode logic is independent of the second decode logic.

15. The memory system of claim 13, wherein the master device is a memory controller.

16. The memory system of claim 15, wherein the integrated circuit memory device is disposed on a memory module.

17. The memory system of claim 13, wherein the plurality of row control signals is provided to a memory core of the integrated circuit memory device.

18. The memory system of claim 17, wherein the memory core includes a row decoder and the plurality of row control signals is provided to the row decoder.

19. The memory system of claim 17, wherein the plurality of column control signals is provided to the memory core of the integrated circuit memory device.

20. The memory system of claim 19, wherein the memory core includes a column decoder and the plurality of column control signals is provided to the column decoder.

21. The memory system of claim 13, wherein the integrated circuit memory device further comprises:
    a first register to sample a first row request packet in the plurality of row request packets using the first clock frequency; and
    a second register to sample the first row request packet in the plurality of row request packets using the first clock frequency.

22. The memory system of claim 13, wherein the first and second decode logic include combinational logic.

23. An integrated circuit memory device comprising:
    a plurality of contacts to receive a plurality of interleaved row and column request packets including row and column memory commands and row and column addresses using a first frequency; and
    means for separating the plurality of memory commands into at least two command streams that provide separate sets of memory control signals using a second frequency to a memory core.

* * * * *

UNITED STATES PATENT AND TRADEMARK OFFICE
CERTIFICATE OF CORRECTION

PATENT NO. : 7,420,874 B2  Page 1 of 1
APPLICATION NO. : 11/099947
DATED : September 2, 2008
INVENTOR(S) : Kasamsetty et al.

It is certified that error appears in the above-identified patent and that said Letters Patent is hereby corrected as shown below:

Col. 10, line 28: after "signals" and before "provided" delete "are" and substitute with --is--

Signed and Sealed this

Sixth Day of January, 2009

JON W. DUDAS
*Director of the United States Patent and Trademark Office*